(12) United States Patent
Chen et al.

(10) Patent No.: US 6,448,110 B1
(45) Date of Patent: *Sep. 10, 2002

(54) METHOD FOR FABRICATING A DUAL-CHIP PACKAGE AND PACKAGE FORMED

(75) Inventors: Tsung-Chieh Chen, Taipei; Chun-Liang Chen, Pingtung, both of (TW)

(73) Assignee: Vanguard International Semiconductor Corporation, Hsin Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/382,436

(22) Filed: Aug. 25, 1999

(51) Int. Cl.[7] ............... H01L 21/44; H01L 21/48; H01L 21/50; H01L 23/48; H01L 23/52; H01L 29/40
(52) U.S. Cl. ........................... 438/109; 257/777
(58) Field of Search .................. 438/107, 109; 257/693, 696, 666, 777

(56) References Cited

U.S. PATENT DOCUMENTS 6,060,769 A * 5/2000 Wark ..................... 257/666
6,077,724 A * 6/2000 Chen ..................... 438/107
6,252,299 B1 * 6/2001 Masuda et al. ............. 257/686

* cited by examiner

*Primary Examiner*—Charles Bowers
*Assistant Examiner*—Nema Berezny
(74) *Attorney, Agent, or Firm*—Tung & Associates

(57) ABSTRACT

A method for forming a back-to-back dual-chip package and package formed are disclosed. In the method, a first IC chip is bonded in its inactive surface to an inactive surface of a second IC chip, while solder balls planted on the active surfaces of both chips. One of the chips is connected to lead fingers of a lead frame by the solder balls. The dual-chip assembly together with the lead fingers are then encapsulated in an insulating material for protecting the chips while exposing substantially the solder balls on the IC chip that was not connected to the lead fingers. The encapsulated assembly can then be connected to an outside circuit, such as a printed circuit board, by forming the exposed finger leads for soldering and by fusing the solder balls to the outside circuit. The present invention novel method and device formed advantageously utilize existing chip design for achieving a high density device at a low cost. For instance, by doubling up two memory chips and doubling its memory capacity, existing memory chip design and existing fabrication equipment can be utilized to avoid the high costs of a new high capacity chip design and a new fabrication equipment. The present invention method further presents the benefit that a high density device is achieved with substantially no additional use of chip real estate.

14 Claims, 3 Drawing Sheets

METHOD FOR FABRICATING A DUAL-CHIP PACKAGE AND PACKAGE FORMED

FIELD OF THE INVENTION

The present invention generally relates to a method for packaging integrate circuit chips and packages formed and more particularly, relates to a method for packaging back-to-back dual-chip packages utilizing both lead frame bonding and solder ball bonding techniques and packages formed.

BACKGROUND OF THE INVENTION

In recent years, ball grid array (BGA) packages for semiconductor chips have been used extensively in the semiconductor industry. BGA packages utilize solder balls for establishing electrical interconnections between a chip and a printed circuit board (PCB) and provide high quality and reliability. It has been commonly used in CPU chips in personal computers, in chips of multichip modules and in other high I/O chips.

A BGA package can be made more compact in size than other packages, for instance, than a plastic quad flat package (PQFP). A BGA package which has an IC chip wire bonded to a substrate can be easily soldered to a printed circuit board by solder balls which are arranged in an area array. Other benefits can also be achieved by the BGA package. For instance, there are fewer soldering defects in a BGA assembly when compared to the PQFPs and the self-alignment effect of the solder balls. As a result, minor misalignments in the mounting position can be automatically corrected by the surface tension of the molten solder during a reflow process.

The BGA package utilizes an area array external electrodes which are normally formed of lead/tin solder balls. The solder balls are placed on a back surface of the package at spacings between about 1 mm and about 1.5 mm. The BGA package further provides the benefits of higher external pin-count density, larger thermal paths to the package surroundings and improved pre-testability.

A typical BGA package 10 is shown in FIG. 1A in an enlarged, cross-sectional view. The package 10 is constructed by first bonding an IC die 12 to a substrate 14 by an adhesive layer 28 and then making electrical connections between the two by wire bonds 16. The IC die 12 is typically interconnected to a plastic resin molded substrate 14 in a transfer molding process. Solder balls 20 are then attached to the backside 18 of the substrate 14 in a post-molding operation. A plastic molding compound or encapsulant 24 is utilized in the transfer molding process to encapsulate the IC die 12 and the bonding wires 16 with a top surface 22 of the substrate. Inside the substrates 14 and 18, is a double-sided printed wiring board (PWB) 30 which has copper laminated to both sides of an insulating plastic material. Via holes 26 are drilled and filled with a conductive metal, i.e., electroless copper, followed by a platform plating process. In more sophisticated BGA package structures, multi-layer substrates which have broader power planes or ground planes, or both are utilized for low inductance and larger thermal-path connections.

Solder balls 20 may be formed on the bottom side 18 of the double-sided PWB 30 by a variety of techniques which include solder-ball attachment and solder-paste screen printing. After the solder balls are formed, a reflow operation usually follows to complete the metallurgical connections.

The BGA package 10 shown in FIG. 1A is formed by a conventional chip scale package technique utilizing wire bonding and plastic encapsulation. The IC chip is mounted in a face-up position with the aluminum bonding pads 32 facing upwardly. In such a position, not only the bonding wires 16 leading from the aluminum bonding pads 32 to the upper copper lead 34 in the PWB 30 need to be excessively long, but also the problem of wire sweep may occur during the plastic molding process. The wire sweep problem causes wire breakage or otherwise defective wire bonds.

In a more recently developed BGA package 40, also known as a micro-BGA package shown in FIG. 1B, an IC chip 42 is first bonded to a TAB (tape automated bonding) tape 44 through lead fingers 46 and gold coated copper interconnects 48. After TAB bonding, solder balls 52 are formed on the TAB tape 44 for making connections with the lead fingers 46 and subsequently with the IC chip 42. The handling of the flexible TAB tape 44 and the lead fingers 46 is problematic and frequently cause processing difficulties. In the final stage of the process, a liquid epoxy molding compound 54 and an elastomeric compound 56 are sequentially injected into a mold in which the chip 42 and the tape 44 are positioned to encapsulate the package 40. In the micro-BGA structure 40, the fabrication process is complicated since the alignment between the IC chip 42, the lead fingers 46 and the TAB tape 44 must be precisely controlled, the packaging process can only be carried out at a high cost.

Attempts have been made by others to bond two IC chips arranged in a face-to-face relationship to a single site of finger leads situated in a tape lead frame. This is shown in FIG. 1C. The finger leads contained at the single site in the lead frame are divided into two groups which are bonded to two IC chips in two separate bonding processes. The first group has its inner free ends configured to contact bumps on a first chip, while the second group of finger leads are configured outside the periphery of the first chip after it is bonded to the tape. As shown in FIG. 1C, a first IC chip 36 is first bonded to a plurality of long finger leads 38 by solder bumps 58. A second IC chip 50 is then bonded to a plurality of short finger leads (not shown) by solder bumps 60. The completed assembly, which includes the fist IC chip 36 and the second IC chip 50 is then encapsulated in an insulating material 62 to protect the structure. The method, eventhough allowing a higher package density requires complicated lead frame formation and a two-step lead finger bonding process.

It is therefore an object of the present invention to provide a method for forming a dual-chip package that does not have the drawbacks or shortcomings of the conventional dual-chip packages.

It is another object of the present invention to provide a method for forming a dual-chip package wherein two IC chips are arranged in a back-to-back configuration.

It is a further object of the present invention to provide a back-to-back dual-chip package that combines the benefits of a BGA process and a lead frame bonding process in a single package.

It is another further object of the present invention to provide a back-to-back dual-chip package for memory devices by utilizing existing memory chip design and fabrication equipment.

It is still another object of the present invention to provide a method for forming a back-to-back dual-chip package wherein a first chip is connected to the outside circuit by lead fingers and a second chip is connected to the outside circuit by solder balls.

It is yet another object of the present invention to provide a method for forming a back-to-back dual-chip package and encapsulating the package in an insulating plastic.

It is still another further object of the present invention to provide a method for forming a back-to-back dual-chip package wherein both solder balls and lead fingers are used for connection to outside circuits on a printed circuit board.

It is yet another further object of the present invention to provide a back-to-back dual-chip package which includes a plurality of finger leads for a first chip and a plurality of solder balls for a second chip for connecting to outside circuits.

SUMMARY OF THE INVENTION

In accordance with the present invention, a method for forming a back-to-back dual-chip package and devices formed by the method are provided.

In a preferred embodiment, a method for forming a back-to-back dual-chip package can be carried out by the operating steps of providing a first IC chip which has a first plurality of conductive elements formed on a top surface, planting a first plurality of solder balls on the first plurality of conductive elements on the first IC chip, providing a lead frame which has a first plurality of lead fingers emanating therefrom, bonding the first plurality of solder balls to free ends of the first plurality of lead fingers, providing a second IC chip which has a second plurality of conductive elements formed on a top surface, planting a second plurality of solder balls on the second plurality of conductive elements, bonding a bottom surface of the first IC chip to a bottom surface of the second IC chip by adhesive means, and encapsulating the first and second IC chips in an insulating material with the first IC chip facing upwardly and the second IC chip facing downwardly such that the first plurality of solder balls and the free ends of the first plurality of lead fingers are substantially covered by the insulating material while the second plurality of solder balls are substantially exposed.

The method for forming a back-to-back dual-chip package may further include the step of providing a first IC chip which has a first plurality of bond pads or copper traces formed on a top surface, the step of planting a first plurality of solder balls on the first plurality of conductive elements by a screen printing technique or an electroless plating technique, or the step of bonding the first plurality of solder balls to free ends of the first plurality of lead fingers which are coated with a solder material. The method may further include the step of providing a second IC chip which has a total planar area that is substantially similar to the total planar area of the first IC chip. The method may further include the step of planting a second plurality of solder balls on the second plurality of conductive elements by a screen printing or an electroless plating technique.

In the method, the first plurality and the second plurality of solder balls may be formed of a solder material containing Pb and Sn. The adhesive means may be a thermally conductive adhesive that contains metal particles. The adhesive means may be an epoxy-based adhesive. The adhesive means may also be a thermoset polymeric material. The insulating material used to encapsulate the first and second IC chips is a thermoset polymeric material. The method may further include the step of connecting the second plurality of solder balls to a printed circuit board. The opposite ends of the first plurality of lead fingers may be exposed outside the insulating material after the encapsulating step. The opposite ends of the first plurality of lead fingers may be exposed outside the insulating material and formed for connecting to a printed circuit board.

The present invention is further directed to a back-to-back dual-chip package which includes a first IC chip that has a first plurality of conductive elements formed on a top surface, a first plurality of solder balls on the first plurality of conductive elements, a lead frame which has a first plurality of lead fingers emanating therefrom, a first plurality of free ends of the first plurality of lead fingers bonded to the first plurality of solder balls, a second IC chip which has a second plurality of conductive element formed on a top surface, a second plurality of solder balls on the second plurality of conductive elements, an adhesive layer bonding a bottom surface of the first IC chip to a bottom surface of the second IC chip, and an encapsulating compound covering the first and second IC chips with the first chip facing upwardly and the second chip facing downwardly, while the second plurality of solder balls are substantially exposed.

In the back-to-back dual-chip package, the first and the second plurality of conductive elements may be formed of bond pads or copper traces. The free ends of the first plurality of lead fingers may be covered with a solder material prior to bonding with the first plurality of solder balls. The first IC chip and the second IC chip may have substantially the same planar area. The first plurality and the second plurality of solder balls may be formed of a material containing Pb/Sn.

In the back-to-back dual-chip package, the adhesive means for bonding the first chip to the second chip may be a thermally conductive adhesive. The adhesive means may also be an epoxy-based material. The insulating material for encapsulating the first and second IC chips may be a thermoset-based polymeric material. The opposite ends of the first plurality of lead fingers maybe exposed outside the insulating material. The opposite ends of the first plurality of lead fingers may be exposed outside the insulating material and formed for connecting to a printed circuit board. The dual-chip package may further include a printed circuit board which is connected to the second plurality of solder balls on the second IC chip.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention discloses a method for forming a back-to-back dual-chip package that utilizes both the solder ball connection and the lead finger connection techniques and a package formed by the method.

The present invention novel method provides an economical means for achieving a high capacity package of memory device by utilizing existing memory chip design and fabrication equipment. For instance, a 32 mega-byte memory chip may be packaged in a back-to-back configuration to another 32 mega-byte memory chip such that a total memory capacity of 64 mega-byte chip may be achieved utilizing substantially the same chip real estate. The dual-chip package may only be slightly thicker than a single chip package. A low cost 64 mega-byte memory chip can be made at a lower cost than a single 64 mega-byte memory chip. The present invention novel method further provides the benefit that existing fabrication equipment may be easily adapted for fabricating the dual-chip package without requiring the expenditures for new equipment.

The present invention novel method further utilizes well established semiconductor fabrication techniques such as the TAB bonding technique and the solder ball planting and connection techniques. It provides a reliable fabrication method for making dual-chip packages that occupies essentially the same surface area of a single chip while only increases the thickness slightly. The present invention novel method therefore allows a high density packaging of IC chips by saving chip real estate. Since the present invention packaging method is not entirely dependent upon making connections by lead fingers situated in a lead frame, the method is not limited by the number of I/O's on an IC chip which frequently limit the conventional high density packages by utilizing solder balls formed on a bottom surface of the package. The present invention novel method therefore achieves the beneficial effects of both a lead frame bonding technique and a solder ball bonding technique.

Figure 1A:
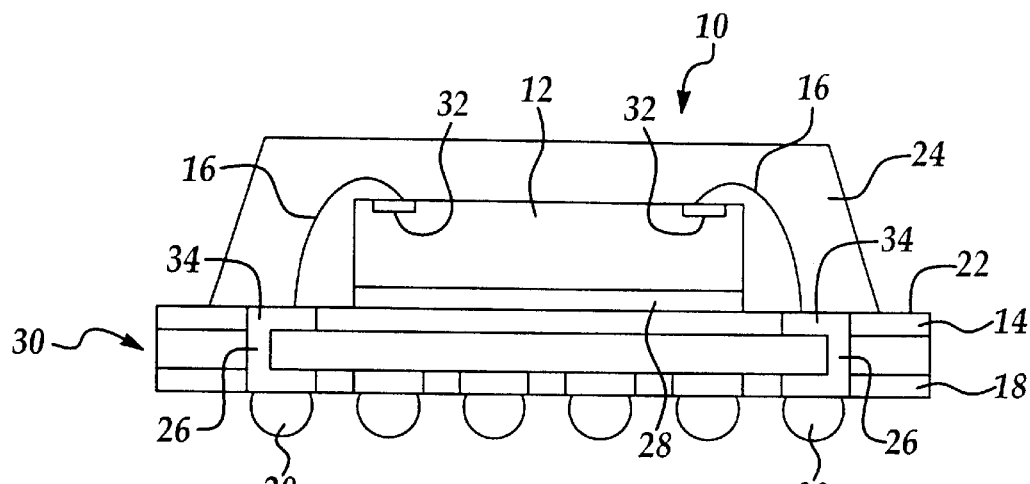
FIG. 1A is an enlarged, cross-sectional view of a conventional BGA package formed on a double-faced printed wiring board.
Figure 1B:
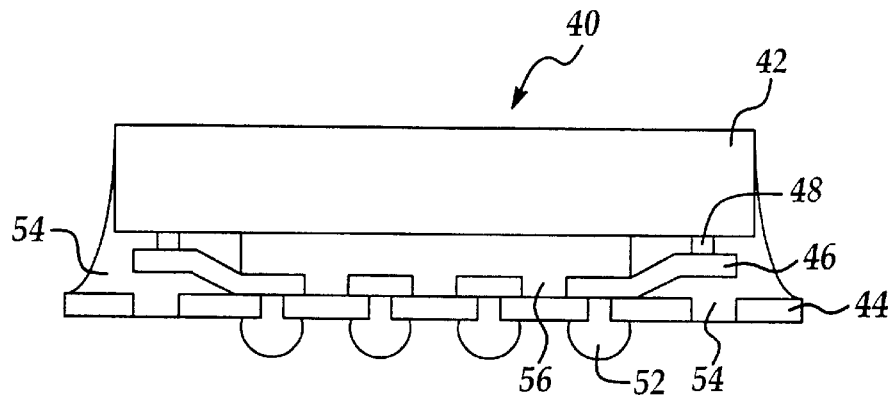
FIG. 1B is an enlarged, cross-sectional view of a micro-BGA package with a flexible lead frame encapsulated in plastic.
Figure 1C:
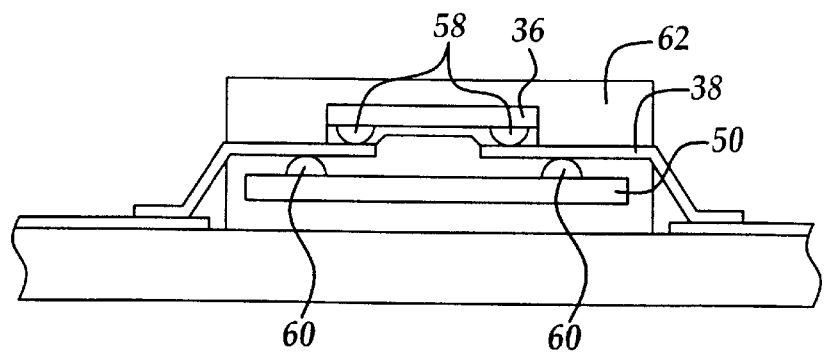
FIG. 1C is an enlarged, cross-sectional view of a conventional dual-chip package utilizing two separate sets of lead fingers for connection between the chips and the printed circuit board.
Figure 2A:
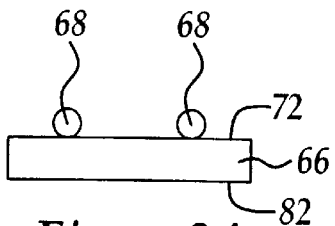
FIG. 2A is an enlarged, cross-sectional view of a present invention IC chip having inner solder balls formed thereon.
Figure 2B:
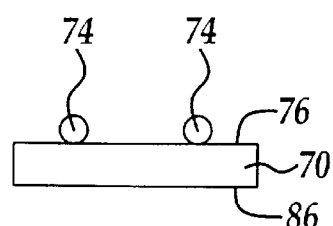
FIG. 2B is an enlarged, cross-sectional view of a present invention IC chip having outer solder balls formed thereon.
Figure 2C:
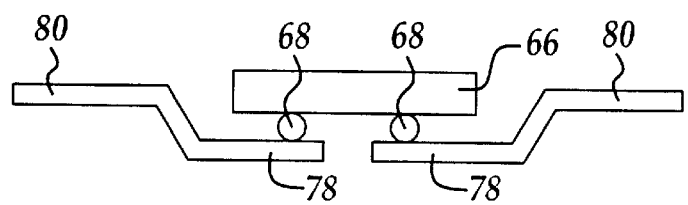
FIG. 2C is an enlarged, cross-sectional view of the present invention IC chip of FIG. 2A after bonded to lead fingers in a lead frame.
Figure 2D:
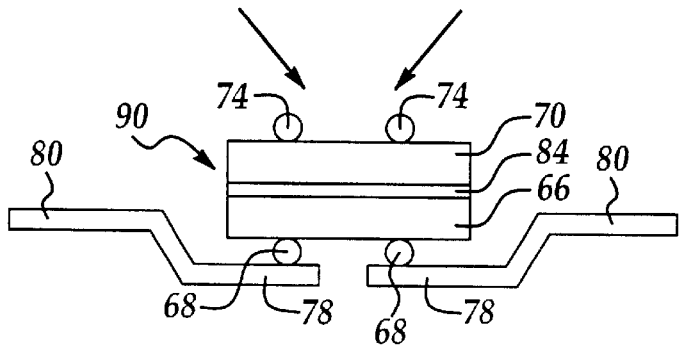
FIG. 2D is an enlarged, cross-sectional view of the present invention IC chip of FIG. 2B bonded to the backside of the present invention IC chip of FIG. 2C.

The present invention novel method may be fully described in FIGS. 2A~2E. FIG. 2A shows an enlarged, cross-sectional view of a present invention IC chip 66 which has a first plurality of solder balls 68 planted on a top surface 72. A second IC chip 70, as shown in FIG. 2B, is similarly prepared by growing solder balls 74 on a top surface 76. In the next step of the method, the IC chip 66 is bonded to lead fingers 78 situated in the lead frame 80 by solder balls 68. This can be executed in a thermode device under pressure and elevated temperature. After the thermode bonding step, the bottom side 86 of the second IC chip 70 is bonded to the bottom side 82 of the IC chip 66 to form assembly 90. An adhesive layer 84 is utilized for the bonding process. The adhesive layer 84 may be advantageously a thermally conductive and electrically insulating material of polymeric base. The adhesive layer 84 may further be loaded with metal particles to enhance its thermal conductivity and heat distribution in order to dissipate heat generated in the IC chips 66 and 70.

Figure 2E:
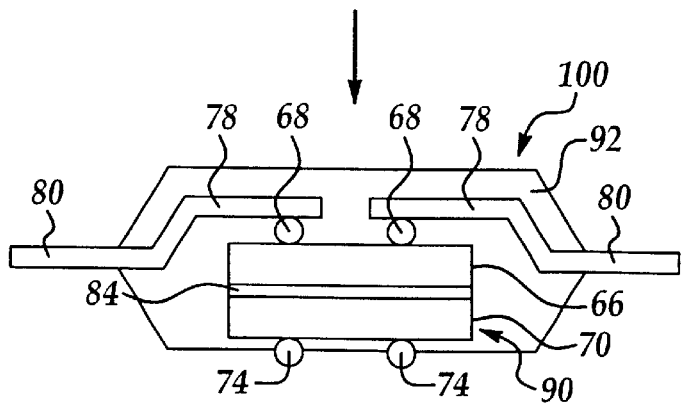
FIG. 2E is an enlarged, cross-sectional view of the present invention dual-chip package of FIG. 2D after encapsulation in an insulate material.

In the next step of the process, as shown in FIG. 2E in an upside down position, the IC chip assembly 90 is encapsulated in a plastic molding compound 92 while the solder balls 74 substantially exposed. The solder balls 74 are then connected electrically to a printed circuit board for establishing electrical communication with outside circuits situated on a printed circuit board. The plastic molding compound 92 may be suitably an insulating material of polymeric base such as an epoxy. It should have adequate viscosity so that the compound fills up a mold cavity completely without voids.

Figure 3:
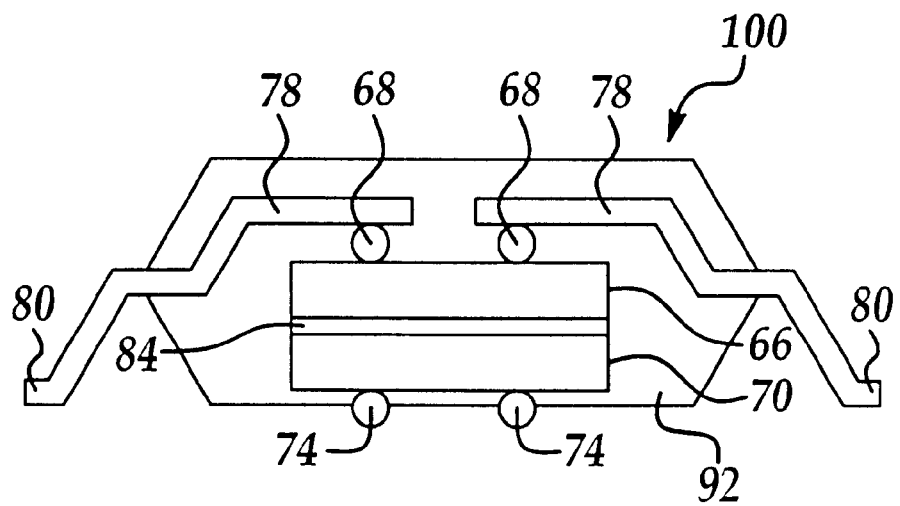
FIG. 3 is an enlarged, cross-sectional view of the present invention dual-chip package of FIG. 2E after the exposed lead fingers are formed for connecting to an outside circuit.
Figure 4:
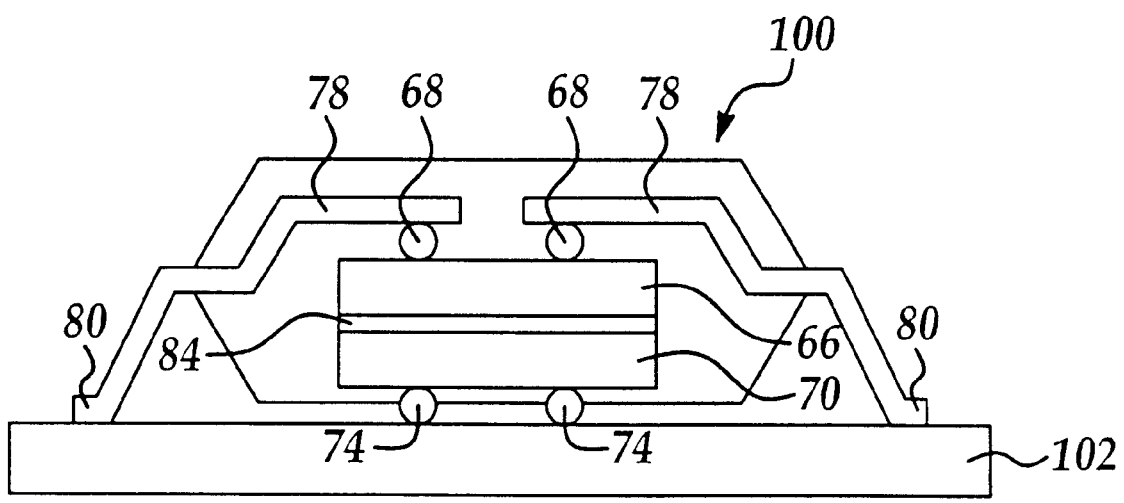
FIG. 4 is an enlarged, cross-sectional view of the present invention dual-chip package of FIG. 3 after the solder balls and the lead fingers are bonded to a printed circuit board.

The dual-chip assembly 100 formed after encapsulation can be further processed by bending the outer ends 80 of the lead fingers into desirable shapes such that they may be easily connected to a circuit board. This is shown in FIG. 3. It should be noted that the outer ends 80 of the lead fingers may be shaped for either soldering to a circuit board or for assembling to other package means such as by frictional engagement. When the dual-chip assembly 100 is mounted and connected to a printed circuit board 102, as shown in FIG. 4, the solder balls 74 may be simultaneously connected to bonding sites (not shown) on the board 102. The present invention novel method and devices formed therefore realize the beneficial effects of both a lead frame bonding technique and a solder ball connection technique.

The present invention novel method and devices formed by such method have therefore been amply demonstrated in the above descriptions and in the appended drawings of FIGS. 2A~4. While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for forming a back-to-back dual-memory chip package to double its memory capacity comprising the steps of:

providing a first memory chip having a first plurality of conductive elements formed on a top surface a first plurality of solder balls on said first plurality of conductive elements, providing a lead frame having a first plurality of lead fingers emanating therefrom, bonding said first plurality of solder balls to free ends of said first plurality of lead fingers, providing a second memory chip that is identical to said first memory chip, bonding a bottom surface of said first memory chip to a bottom surface of said second memory chip by adhesive means, and encapsulating said first and second memory chips in an insulating material with said first memory chip facing upwardly and said second memory chip facing downwardly such that said first plurality of solder balls and said free ends of said first plurality of lead fingers are substantially covered by said insulating material while a second plurality of solder balls on said second memory chip is substantially exposed.

2. A method for forming a back-to-back dual-memory chip package to double its memory capacity according to the method of claim 1 further comprising the step of providing a first memory chip having a first plurality of bond pads or copper tracers formed on a top surface.

3. A method for forming a back-to-back dual-memory chip package to double its memory capacity according to the method of claim 1 further comprising the step of planting a first plurality of solder balls on said first plurality of conductive elements by a screen printing technique or an electroless plating technique.

4. A method for forming a back-to-back dual-memory chip package to double its memory capacity according to claim 1 further comprising the step of bonding the first plurality of solder balls to free ends of the first plurality of lead fingers coated with a solder material.

5. A method for forming a back-to-back dual-memory chip package to double its memory capacity according to claim 1 further comprising the step of providing a second memory chip which has a total planar area that is substantially similar to the total planar area of said first memory chip.

6. A method for forming a back-to-back dual-memory chip package to double its memory capacity according to claim 1 further comprising the step of planting a second plurality of solder balls on said second plurality of conductive elements by a screen printing technique or an electroless plating technique.

7. A method for forming a back-to-back dual-memory chip package to double its memory capacity according to claim 1, wherein said first plurality and second plurality of solder balls are formed of a solder material containing Pb and Sn.

8. A method for forming a back-to-back dual-memory chip package to double its memory capacity according to claim 1, wherein said adhesive means is a thermally conductive adhesive that contains metal particles.

9. A method for forming a back-to-back dual-memory chip package to double its memory capacity according to claim 1, wherein said adhesive means is an epoxy-based adhesive.

10. A method for forming a back-to-back dual-memory chip package to double its memory capacity according to claim 1, wherein said adhesive means is a thermoset polymeric material.

11. A method for forming a back-to-back dual-memory chip package to double its memory capacity according to claim 1, wherein said insulating material used to encapsulate said first and second memory chips is a thermoset polymeric material.

12. A method for forming a back-to-back dual-memory chip package to double its memory capacity according to claim 1 further comprising the step of connecting said second plurality of solder balls to a printed circuit board.

13. A method for forming a back-to-back dual-memory chip package to double its memory capacity according to claim 1, wherein opposite ends of said first plurality of lead fingers are exposed outside said insulating material after said encapsulating step.

14. A method for forming a back-to-back dual-memory chip package to double its memory capacity according to claim 1, wherein opposite ends of said first plurality of lead fingers are exposed outside said insulating material and formed for connecting to a printed circuit board.

* * * * *